US010605839B2

(12) United States Patent
Paech et al.

(10) Patent No.: US 10,605,839 B2
(45) Date of Patent: Mar. 31, 2020

(54) METHOD AND SYSTEM FOR THE DETERMINATION OF SCATTERING COEFFICIENTS OF A FREQUENCY-CONVERTING DEVICE UNDER TEST

(71) Applicant: Rohde & Schwarz GmbH & Co. KG, Munich (DE)

(72) Inventors: Andreas Paech, Munich (DE); Georg Ortler, Geesertshausen (DE); Steffen Neidhardt, Dorfen (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 565 days.

(21) Appl. No.: 14/416,598

(22) PCT Filed: Oct. 10, 2013

(86) PCT No.: PCT/EP2013/071132
§ 371 (c)(1),
(2) Date: Jan. 22, 2015

(87) PCT Pub. No.: WO2014/057020
PCT Pub. Date: Apr. 17, 2014

(65) Prior Publication Data
US 2015/0177300 A1    Jun. 25, 2015

(30) Foreign Application Priority Data

Oct. 10, 2012   (DE) .................... 10 2012 218 431
Jan. 3, 2013    (DE) .................... 10 2013 200 033

(51) Int. Cl.
*G01R 27/28*     (2006.01)
(52) U.S. Cl.
CPC ................... *G01R 27/28* (2013.01)

(58) Field of Classification Search
CPC ....................................................... G01R 27/28
(Continued)

(56) References Cited

U.S. PATENT DOCUMENTS 5,168,493 A * 12/1992 Nelson ................ H04W 8/245
340/7.43
5,337,014 A *  8/1994 Najle ..................... G01R 29/26
324/613
(Continued)

FOREIGN PATENT DOCUMENTS

CA          2864298 A1 * 10/2013 .......... G01R 35/005
DE    10 2006 035 827 A1    9/2007
(Continued)

OTHER PUBLICATIONS

Wendy Van Moer and Yves Rolain, "A Large-Signal Network Analyzer: Why Is It Needed", IEEE microwave magazine, Dec. 2006.*

*Primary Examiner* — Janet L Suglo
*Assistant Examiner* — Douglas Kay
(74) *Attorney, Agent, or Firm* — Ditthavong & Steiner, P.C.

(57) ABSTRACT

A system for determining scattering parameters of a frequency-converting device under test using a network analyzer determines the system errors which occur between the individual ports (1, 2) of the frequency-converting device under test (3) and the ports (4, 5) of the network analyzer (6) connected to the ports (1, 2) of the frequency-converting device under test (3) and measures the system-error-containing signals incoming and outgoing in each case at the individual ports (1, 2) of the frequency-converting device under test (3). Following this, system-error-adjusted signals incoming and outgoing in each case at the individual ports (1, 2) of the frequency-converting device under test (3) are determined by weighting the system-error-containing sig- (Continued)

nals incoming and outgoing in each case at the individual ports (1, 2) of the frequency-converting device under test (3) with the associated, determined system errors, and the scattering parameters of the frequency-converting device under test (3) are determined from the system-error-adjusted signals incoming and outgoing in each case at the individual ports (1, 2) of the frequency-converting device under test (3). The phase of the signal to be measured exciting, in each case, a port (1, 2) of the frequency-converting device under test (3) is initialized in an identical manner in every measurement.

18 Claims, 5 Drawing Sheets

(58) Field of Classification Search
USPC .......................................................... 702/66
See application file for complete search history.

(56) References Cited

U.S. PATENT DOCUMENTS

| | | | | |
|---|---|---|---|---|
| 5,631,553 | A * | 5/1997 | Bose | G01R 19/2506 324/76.23 |
| 5,748,506 | A * | 5/1998 | Bockelman | G01R 35/00 324/601 |
| 5,793,213 | A * | 8/1998 | Bockelman | G01R 35/005 324/601 |
| 6,175,239 | B1 * | 1/2001 | Hall | G01R 27/32 324/647 |
| 6,292,000 | B1 | 9/2001 | Kapetanic et al. | |
| 6,417,674 | B1 * | 7/2002 | Rowell, Jr. | G01R 35/005 324/601 |
| 6,529,844 | B1 | 3/2003 | Kapetanic et al. | |
| 6,965,241 | B1 * | 11/2005 | Liu | G01R 27/28 324/601 |
| 7,231,311 | B2 * | 6/2007 | Verspecht | G01R 23/20 702/109 |
| 7,671,605 | B2 * | 3/2010 | Gunyan | G01R 27/32 324/612 |
| 8,022,687 | B2 * | 9/2011 | Ortler | G01R 35/005 324/638 |
| 8,248,297 | B1 * | 8/2012 | Baker | G01S 7/4052 342/159 |
| 8,296,086 | B2 * | 10/2012 | Sternberg | H04B 17/101 702/66 |
| 9,091,724 | B2 * | 7/2015 | Ortler | H03L 7/23 |
| 9,801,082 | B2 * | 10/2017 | Entsfellner | H04W 24/06 |
| 2005/0030047 | A1 * | 2/2005 | Adamian | G01R 27/28 324/650 |
| 2005/0248377 | A1 * | 11/2005 | Drexler | G11C 7/22 327/158 |
| 2005/0271164 | A1 * | 12/2005 | Moulthrop | H04L 27/3863 375/332 |
| 2006/0235638 | A1 * | 10/2006 | Verspecht | G01R 23/20 702/118 |
| 2007/0194887 | A1 * | 8/2007 | Kung | H04B 1/525 340/10.1 |
| 2007/0241760 | A1 * | 10/2007 | Yamasaki | G01R 27/28 324/601 |
| 2008/0258707 | A1 | 10/2008 | Dunsmore et al. | |
| 2009/0092177 | A1 * | 4/2009 | Dvorak | H04B 17/101 375/224 |
| 2011/0054835 | A1 * | 3/2011 | Takamasu | G01B 5/008 702/150 |
| 2011/0288820 | A1 * | 11/2011 | Bednorz | G01R 23/20 702/176 |
| 2012/0109566 | A1 * | 5/2012 | Adamian | G01R 27/28 702/107 |
| 2012/0161749 | A1 * | 6/2012 | Sternberg | H04B 17/21 324/76.23 |
| 2015/0071097 | A1 * | 3/2015 | Entsfellner | G01R 35/005 370/252 |
| 2015/0177300 | A1 * | 6/2015 | Paech | G01R 27/32 702/66 |

FOREIGN PATENT DOCUMENTS

| | | | | |
|---|---|---|---|---|
| DE | 10200603582 | * | 9/2007 | ............ G01R 27/28 |
| DE | 102009011795 | A1 | 9/2010 | |
| DE | 102012006195 | A1 * | 10/2013 | .......... G01R 35/005 |
| WO | 2007/080072 | A1 | 7/2007 | |
| WO | 2010/099855 | A1 | 9/2010 | |
| WO | WO 2010099855 | A1 * | 9/2010 | ........ G01R 31/2841 |
| WO | 2013/143681 | A1 | 10/2013 | |
| WO | WO 2013143681 | A1 * | 10/2013 | .......... G01R 35/005 |

\* cited by examiner

METHOD AND SYSTEM FOR THE DETERMINATION OF SCATTERING COEFFICIENTS OF A FREQUENCY-CONVERTING DEVICE UNDER TEST

CROSS-REFERENCE TO RELATED APPLICATION

The present application a national phase application of PCT 10 Application No. PCT/EP2013/071132, filed Oct. 10, 2013, and claims priority to German Application No. DE 10 2012 218 431.7, filed on Oct. 10, 2012, and German Application No. DE 10 2013 200 033.2, filed on Jan. 3, 2013, the entire contents of which are herein incorporated by reference.

BACKGROUND OF THE INVENTION

Field of the Invention

The invention, according to the various embodiments described herein, relates to a method and a system for determining scattering parameters of a frequency-converting device under test.

Discussion of the Background

In order to characterise the electrical behaviour of a frequency-converting component, preferably of a mixer, the scattering parameters of the frequency-converting component are determined using a network analyzer. On the basis of error matchings at the ports of the device under test, or respectively of the network analyzer, and the non-ideal behaviour of the network analyzer, system errors by comparison with the corresponding correct measured values are superposed on the measured values registered.

These system errors must be determined in advance in a calibration and are then used for the compensation of the system errors in the measured values registered in order to determine the correct measured values. In this context, conventional one-port or respectively two-port error models, for example, 7-term, 9-term or 10-term methods according to the prior art are used. In the following, by way of example, the 7-term method is used or respectively the 3-term and the 4-term method are used twice.

In this context, the system errors determined for every port i to be measured of the frequency-converting device under test are the directivity (English: directivity) $D_i$, the source match (English: source match) $S_i$, the forward tracking (English: forward tracking) $F_i$ and the reflection tracking (English: reflection tracking) $R_i$, which are illustrated in FIG. 1 for a 2-port device under test. The interrelationship between the measured incoming or respectively outgoing wave values $\hat{a}_i$ respectively $\hat{b}_i$ and the correct incoming or respectively outgoing wave values $a_i$ respectively $b_i$ over the determined system errors is obtained according to equation (1) with the system-error matrix $G_i$ containing the individual measured system errors according to equation (2).

$$\begin{pmatrix} a_i \\ b_i \end{pmatrix} = G_i \cdot \begin{pmatrix} \hat{a}_i \\ \hat{b}_i \end{pmatrix} \quad (1)$$

$$G_i = \begin{pmatrix} F_i - \dfrac{D_i \cdot S_i}{R_i} & \dfrac{S_i}{R_i} \\ -\dfrac{D_i}{R_i} & \dfrac{1}{R_i} \end{pmatrix} \quad (2)$$

The incoming respectively outgoing wave values represent frequency-dependent signals and, for the sake of simplicity, are designated in the following as incoming respectively outgoing signals.

The matrix elements of a determined system-error matrix $\tilde{G}_i$ which differ, apart from an unknown complex factor $d_i$, from the exact system errors of the respective port i, are obtained, for the measurement exclusively of the fundamental harmonic according to equation (3A), from the correct system-error matrix $G_i$ by weighting with the unknown complex factor $d_i$. In the case of a measurement of higher harmonics and intermodulation products at the frequency k, the determined system-error matrix $\tilde{G}_i^k$ according to equation (3B) is obtained from the correct system-error matrix $G_i^k$ for higher harmonics and intermodulation products at the frequency k by weighting with the unknown complex factor $d_i$.

$$\tilde{G}_i = d_i \cdot G_i \text{ with } \tilde{G}_i = \begin{pmatrix} \tilde{F}_i - \dfrac{\tilde{D}_i \cdot \tilde{S}_i}{\tilde{R}_i} & \dfrac{\tilde{S}_i}{\tilde{R}_i} \\ -\dfrac{\tilde{D}_i}{\tilde{R}_i} & \dfrac{1}{\tilde{R}_i} \end{pmatrix} \quad (3A)$$

$$\tilde{G}_i^k = d_i^k \cdot G_i^k \text{ with } G_i^k = \begin{pmatrix} F_i^k - \dfrac{D_i^k \cdot S_i^k}{R_i^k} & \dfrac{S_i^k}{R_i^k} \\ -\dfrac{D_i^k}{R_i^k} & \dfrac{1}{R_i^k} \end{pmatrix} \quad (3B)$$

and $$\tilde{G}_i^k = \begin{pmatrix} \tilde{F}_i^k - \dfrac{\tilde{D}_i^k \cdot \tilde{S}_i^k}{\tilde{R}_i^k} & \dfrac{\tilde{S}_i^k}{\tilde{R}_i^k} \\ -\dfrac{\tilde{D}_i^k}{\tilde{R}_i^k} & \dfrac{1}{\tilde{R}_i^k} \end{pmatrix}$$

In the case of non-frequency-converting devices under test, the error terms at the two ports of the error model, which each derive from a two-port calibration, are scaled consistently with one another and are dependent only upon a constant, which is identical in each case for both ports. The unknown complex factor $d_i$ is accordingly identical for every port i of the device under test. Since every scattering parameter of the device under test is obtained as a ratio between two signals—an incoming and outgoing signal—at an identical port or at two different ports, this unknown complex factor $d_i$ is cancelled out from the latter and accordingly does not represent a problem.

In the case of frequency-converting devices under test with different frequency and therefore phase relationships between the two ports to be measured, the magnitude component $|d_i|$ of the unknown complex factor $d_i$ is determined using a level-calibration at both ports and taken into consideration in the system-error compensation. The magnitude component $|d_i|$ of the unknown complex factor $d_i$ in this context is different for each port because of the different frequencies. For the determination of the phase component $e^{j\varphi_{d_i}}$ of the unknown complex factor $d_i$, a phase reference or respectively a phase standard is used.

The use of a phase reference, respectively a phase standard, in the calibration of a phase error, typically restricts the frequency range and the frequency spacing of the phase calibration to be implemented. Added to this is the fact that the quality in the determination of the phase component $e^{j\varphi_{d_i}}$ of the unknown complex factor $d_i$ depends upon the stability and phase uncertainty of the phase reference, respectively of the phase standard, and a complex and accordingly expensive test setup is required in order to achieve a high precision in the determination of the phase $e^{j\varphi_{d_i}}$.

SUMMARY OF THE INVENTION

A method and a system for system-error compensation in the electrical characterisation of a frequency-converting device under test which guarantees a high measurement accuracy with low measurement costs are provided herein.

For every port to be measured of the frequency-converting device under test, in each case, the associated system errors may be determined and, in each case, the incoming respectively outgoing signals still containing system errors may be each measured at the ports to be measured of the frequency-converting device under test. By weighting the system-error-containing, measured incoming respectively outgoing signals in each case at the individual ports to be measured of the frequency-converting device under test with the associated, determined system errors, associated system-error-adjusted incoming respectively outgoing signals are determined, which still contain the amplitude and phase uncertainty of an unknown factor. The scattering parameters of the frequency-converting device under test may be determined from the system-error-adjusted incoming respectively outgoing signals, in each case at the individual ports to be measured of the frequency-converting device under test.

In particular, in order to compensate the phase inaccuracy in the determined system errors at the individual ports to be measured of the frequency-converting device under test, the phases of the signal exciting the frequency-converting device under test may be initialized according to one embodiment in every measurement in an identical manner. This guarantees, as will be shown in greater detail below, that the phase inaccuracy has been removed from the reflection parameters of the frequency-converting device under test determined in this manner.

Additionally, the phase of the local-oscillator signal for the frequency-converting device under test is preferably initialized in a phase-coherent manner to the phase of the excitation signal in every measurement. This guarantees that an identical phase is present in every case, at the time of the initialization, at all three ports of the frequency-converting device under test.

Finally, the phases of the oscillator signals for the individual mixers in the individual measurement-signal paths may be initialized in a phase-coherent manner to the phase of the excitation signal, so that, at the time of the initialization, an identical phase is also achieved in the detectors at the output of the individual measurement-signal paths.

The magnitude component of the unknown complex factor $d_i$ in the individual coefficients of the determined system-error matrix $\tilde{G}_i$ may be determined by means of a level calibration.

While the magnitude components and, at the same time, the phase components can be compensated through these measures for the reflection parameters of the frequency-converting device under test, only the magnitude components may be compensated in the transmission parameters of the frequency-converting device under test. The transmission parameters of the frequency-converting device under test continue to provide a phase inaccuracy. However, in the case of a pure magnitude consideration of the transmission parameters, the phase uncertainty is not relevant.

In order to realize a phase-coherent initialization of the excitation signal and the local oscillator signals in every individual measurement, the associated signal generators, which in each case generate an excitation signal or a local-oscillator signal, may be each set up according to the direct-digital synthesis principle (DDS) or as numerically controlled oscillators. For this purpose, they each provide at least one buffer with phase values of a sinusoidal signal spaced equidistantly in time.

Additionally, a clock generator can be provided which generates a clock signal which is supplied to the buffers of the signal generators and serves for the clocked output of the individual phase values of the sinusoidal signal at the output of the respective buffer.

A release unit preferably generates a signal for the initialization of the buffers of the signal generators, which is supplied to the buffers for the output-end output of an identical phase value at the output of the respective buffer at the next clock pulse of the clock signal following after the initialization.

The phase values which are output with the clock pulse of the clock signal in each case at the output of the respective buffer, may be supplied in the case of a signal generator realized according to the DDS principle in each case to a digital-analog converter disposed downstream of the respective buffers, which generates an analog signal corresponding to the discrete phase values at the individual clock-pulse times. This analog signal is, in turn, preferably supplied as a reference signal, within each of the signal generators operating according to the DDS principle, to a phase controller, at the output of which the excitation signal, or respectively the local oscillator signal, is generated in each case.

Through the nonlinear transmission characteristic of a frequency-converting device under test, especially of a mixer, at the fundamental harmonic of the respectively incoming and outgoing signals at the individual ports of the frequency-converting device under test, higher harmonics and intermodulation products of the signals incoming and outgoing in each case at the individual ports of the frequency-converting device under test may arise at other frequencies. In a further embodiment of the invention, the scattering parameters of the frequency-converting device under test may be additionally determined at the frequencies at which the higher harmonics and intermodulation products of the signals incoming and outgoing in each case at the individual ports of the frequency-converting device under test occur. The determination of the scattering parameters in the case of the additional frequencies may be implemented in an equivalent manner from the system-error-adjusted signals incoming and outgoing in each case at the respective port of the frequency-converting device under test at the additional frequencies.

BRIEF DESCRIPTION OF THE DRAWINGS

Exemplary embodiments of the method according to one embodiment and the system for determining scattering parameters of a frequency-converting device under test are explained in detail in the following by way of example. The Figs. of the drawings show.

Figure 1:
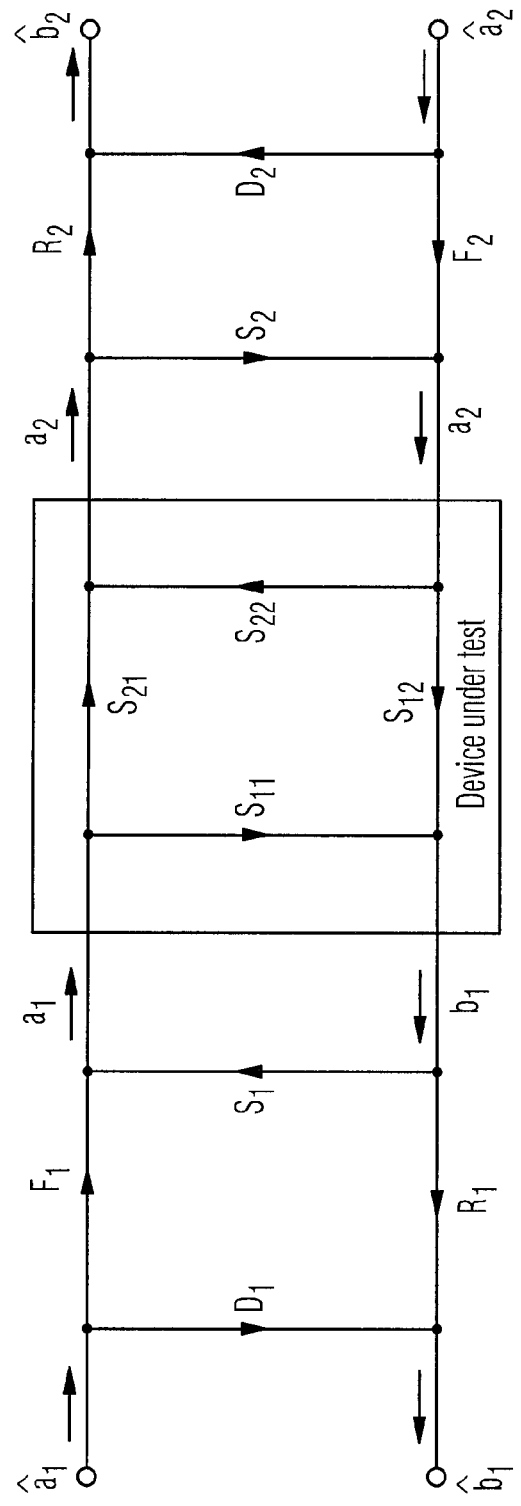
FIG. 1 two one-port error models for a 2-port device under test, according to one embodiment.

On the basis of the mathematical relationships already presented in the introduction, the mathematical background required for understanding of the embodiments will be derived in the following.

A weighting of the incoming and outgoing signals $\hat{a}_i$ and $\hat{b}_i$ registered for each fundamental harmonic at the ports to be measured of the frequency-converting device under test with the associated matrix elements of the system-error matrix $\tilde{G}_i$ determined for the fundamental harmonic associated with each port to be measured of the frequency-converting device under test results, according to equation (4A), for the fundamental harmonic, in the system-error-adjusted incoming and outgoing signals $\tilde{a}_i$ and $\tilde{b}_i$ at each of the ports to be measured of the frequency-converting device under test, which, according to equation (4A), differ in each case from the exact incoming and outgoing signal $a_i$ and $b_i$ at each port i to be measured of the frequency-converting device under test only in the still unknown complex factor $d_i$.

$$\begin{pmatrix} \tilde{a}_i \\ \tilde{b}_i \end{pmatrix} = \tilde{G}_i \cdot \begin{pmatrix} \hat{a}_i \\ \hat{b}_i \end{pmatrix} = d_i \cdot \begin{pmatrix} a_i \\ b_i \end{pmatrix} \quad (4A)$$

For higher harmonics and intermodulation products at the frequency k, the system-error-adjusted incoming and outgoing signals $\tilde{a}_i^k$ and $\tilde{b}_i^k$ are obtained according to equation (4B) at each of the ports to be measured of the frequency-converting device under test by weighting the incoming and outgoing signals $\hat{a}_i^k$ and $\hat{b}_i^k$ registered for higher harmonics and intermodulation products with the frequency k at each of the ports to be measured of the frequency-converting device under test with the system-error matrix $\hat{G}_i^k$ determined in each case for higher harmonics and intermodulation products with the frequency k.

$$\begin{pmatrix} \tilde{a}_i^k \\ \tilde{b}_i^k \end{pmatrix} = \tilde{G}_i^k \cdot \begin{pmatrix} \hat{a}_i^k \\ \hat{b}_i^k \end{pmatrix} = d_i^k \cdot \begin{pmatrix} a_i^k \\ b_i^k \end{pmatrix} \quad (4B)$$

By means of a level calibration, the magnitude component $|d_i|$ of the unknown complex factor $d_i$ can be determined and taken into consideration in equation (4). Accordingly, in the case of a measurement only of the fundamental harmonic, starting from equation (4), a mathematical relationship is obtained which is now only dependent upon the phase $e^{j\varphi_{d_i}}$ of the unknown complex factor $d_i$ between the system-error-adjusted signal $\tilde{a}_i'$ and $\tilde{b}_i'$ incoming and outgoing in each case at the respective port i to be measured of the frequency-converting device under test and the exact incoming and outgoing signals $a_i$ and $b_i$ at each port i to be measured of the respective frequency-converting device under test, taking into consideration the level-optimized system-error matrix $\tilde{G}_i'$ according to equation (5A).

In the case of a measurement of the higher harmonics and intermodulation products with the frequency k, taking into consideration the level-optimized system-error matrix $\tilde{G}_i'^k$, an equivalent interrelationship is obtained according to equation (5B).

$$\begin{pmatrix} \tilde{a}_i' \\ \tilde{b}_i' \end{pmatrix} = \tilde{G}_i' \cdot \begin{pmatrix} \hat{a}_i \\ \hat{b}_i \end{pmatrix} = e^{j\varphi_{d_i}} \cdot \begin{pmatrix} a_i \\ b_i \end{pmatrix} \quad (5A)$$

with $$\tilde{G}_i' = e^{j\varphi_{d_i}} \cdot G_i$$

and $$\tilde{G}_i' = \begin{pmatrix} \frac{1}{|d_i|} \cdot \left( \tilde{F}_i - \frac{\tilde{D}_i \cdot \tilde{S}_i}{\tilde{R}_i} \right) & \frac{1}{|d_i|} \cdot \frac{\tilde{S}_i}{\tilde{R}_i} \\ -\frac{1}{|d_i|} \cdot \frac{\tilde{D}_i}{\tilde{R}_i} & \frac{1}{|d_i|} \cdot \frac{1}{\tilde{R}_i} \end{pmatrix}$$

$$\begin{pmatrix} \tilde{a}_i'^k \\ \tilde{b}_i'^k \end{pmatrix} = \tilde{G}_i'^k \cdot \begin{pmatrix} \hat{a}_i^k \\ \hat{b}_i^k \end{pmatrix} = e^{j\varphi_{d_i}} \cdot \begin{pmatrix} a_i^k \\ b_i^k \end{pmatrix} \quad (5B)$$

with $$\tilde{G}_i'^k = e^{j\varphi_{d_i}} \cdot G_i^k$$

and $$\tilde{G}_i'^k = \begin{pmatrix} \frac{1}{|d_i|} \cdot \left( \tilde{F}_i^k - \frac{\tilde{D}_i^k \cdot \tilde{S}_i^k}{\tilde{R}_i^k} \right) & \frac{1}{|d_i|} \cdot \frac{\tilde{S}_i^k}{\tilde{R}_i^k} \\ -\frac{1}{|d_i|} \cdot \frac{\tilde{D}_i^k}{\tilde{R}_i^k} & \frac{1}{|d_i|} \cdot \frac{1}{\tilde{R}_i^k} \end{pmatrix}$$

The scattering parameters S to be determined of a frequency-converting device under test, preferably of a mixer, are obtained according to equation (6A). The local oscillator signal $a_{Lo}$ is adjusted with regard to its magnitude $|a_{Lo}|$ in such a manner that a scaled magnitude $|a_{Lo}|=1$ is obtained.

$$\begin{pmatrix} b_1 \\ b_2 \end{pmatrix} = \begin{pmatrix} S_{11} & S_{12} \cdot a_{Lo}^* \\ S_{21} \cdot a_{Lo} & S_{22} \end{pmatrix} \cdot \begin{pmatrix} a_1 \\ a_2 \end{pmatrix} \quad (6A)$$

The scattering parameters S of a mixer in the mirror-operating mode are obtained according to equation (6B).

$$\begin{pmatrix} b_1 \\ b_2^* \end{pmatrix} = \begin{pmatrix} S_{11} & S_{12} \cdot a_{Lo} \\ S_{21} \cdot a_{Lo}^* & S_{22} \end{pmatrix} \cdot \begin{pmatrix} a_1 \\ a_2^* \end{pmatrix} \quad (6B)$$

In the following, mixers according to equation (6A) are assumed. However, the embodiments also cover mixers in the mirror-operating mode. In particular, the following presentation is restricted to the fundamental harmonics. The extension to the higher harmonics will be described later.

The scattering parameters S of the frequency-converting device under test can be determined in each case from the incoming and outgoing signals at the individual ports to be measured of the frequency-converting device under test in the case of an excitation of the frequency-converting device under test, in each case at one of the two ports to be measured according to equation (7) from the matrix elements of the matrix A containing the respectively incoming signals and the matrix B containing the respectively outgoing signals. The matrix elements $a_{ij}$ respectively $b_{ij}$ each represent the incoming respectively outgoing signal at each port i in the case of the excitation of the frequency-converting device under test at the port j.

$$S = B \cdot A^{-1} \quad (7)$$

$$= \begin{pmatrix} b_{11} & b_{12} \\ b_{21} & b_{22} \end{pmatrix} \cdot \begin{pmatrix} a_{11} & a_{12} \\ a_{21} & a_{22} \end{pmatrix}^{-1}$$

$$= \begin{pmatrix} b_{11} & b_{12} \\ b_{21} & b_{22} \end{pmatrix} \cdot \frac{1}{a_{11} \cdot a_{22} - a_{12} \cdot a_{21}} \cdot \begin{pmatrix} a_{22} & -a_{12} \\ -a_{21} & a_{11} \end{pmatrix}$$

$$= \frac{1}{a_{11} \cdot a_{22} - a_{12} \cdot a_{21}} \cdot$$

$$\begin{pmatrix} b_{11} \cdot a_{22} - b_{12} \cdot a_{21} & -b_{11} \cdot a_{12} + b_{12} \cdot a_{11} \\ b_{21} \cdot a_{22} - b_{22} \cdot a_{21} & -b_{21} \cdot a_{12} + b_{22} \cdot a_{11} \end{pmatrix}$$

In the first step, the measured or respectively system-error-adjusted scattering parameters of a frequency-converting device under test are derived in the case of a non-phase-reproducible signal generator.

If the phase of a signal generator is not initialized with an identical phase in every measurement and if the phase distortion in every individual measurement-signal path from each associated coupler to each associated detector is not known, according to equation (8A) respectively (8B), with reference to equation (4), an interrelationship is obtained between the system-error-adjusted signals $\tilde{a}_{ij}$ and $\tilde{b}_{ij}$ in each case incoming and outgoing at the respective port i to be measured of the frequency-converting device under test and the exact signals $a_{ij}$ and $b_{ij}$ in each case incoming and outgoing at the respective port i to be measured of the frequency-converting device under test in the case of an excitation of the frequency-converting device under test at the respective port j. In this context, the exact incoming and outgoing signals $a_{ij}$ and $b_{ij}$ are multiplied both by the phase $e^{j\Phi_{d_i}}$ of the unknown complex factor $d_i$ and also by the phase $e^{j\varphi_{ij}}$, which models the unknown starting phase of the excitation signal $a_j$ at the port j of the frequency-converting device under test and also the unknown phase distortion in the signal path from the excitation source to the device under test, in the signal path from the device under test to the detector—the measurement-signal path.

$$\tilde{A} = \begin{pmatrix} \tilde{a}'_{11} & \tilde{a}'_{12} \\ \tilde{a}'_{21} & \tilde{a}'_{22} \end{pmatrix} = \begin{pmatrix} e^{j\varphi_{11}} \cdot e^{j\varphi_{d_1}} \cdot a_{11} & e^{j\varphi_{12}} \cdot e^{j\varphi_{d_1}} \cdot a_{12} \\ e^{j\varphi_{21}} \cdot e^{j\varphi_{d_2}} \cdot a_{21} & e^{j\varphi_{22}} \cdot e^{j\varphi_{d_2}} \cdot a_{22} \end{pmatrix} \quad (8A)$$

$$\tilde{B} = \begin{pmatrix} \tilde{b}'_{11} & \tilde{b}'_{12} \\ \tilde{b}'_{21} & \tilde{b}'_{22} \end{pmatrix} = \begin{pmatrix} e^{j\varphi_{11}} \cdot e^{j\varphi_{d_1}} \cdot b_{11} & e^{j\varphi_{12}} \cdot e^{j\varphi_{d_1}} \cdot b_{12} \\ e^{j\varphi_{21}} \cdot e^{j\varphi_{d_2}} \cdot b_{21} & e^{j\varphi_{22}} \cdot e^{j\varphi_{d_2}} \cdot b_{22} \end{pmatrix} \quad (8B)$$

The measured, or respectively system-error-adjusted, scattering parameters $\tilde{S}$ of the frequency-converting device under test in the case of a use of a non-phase-reproducible signal generator are obtained from the matrix elements of the matrix $\tilde{A}$ containing the system-error-adjusted, incoming signals and the matrix elements of the matrix $\tilde{B}$ containing the system-error-adjusted, outgoing signals according to equation (9).

$$\tilde{S} = \begin{pmatrix} \tilde{S}_{11} & \tilde{S}_{12} \\ \tilde{S}_{21} & \tilde{S}_{22} \end{pmatrix} \quad (9)$$

$$= \begin{pmatrix} e^{j\varphi_{11}} \cdot e^{j\varphi_{d_1}} \cdot b_{11} & e^{j\varphi_{12}} \cdot e^{j\varphi_{d_1}} \cdot b_{12} \\ e^{j\varphi_{21}} \cdot e^{j\varphi_{d_2}} \cdot b_{21} & e^{j\varphi_{22}} \cdot e^{j\varphi_{d_2}} \cdot b_{22} \end{pmatrix} \cdot$$

$$\begin{pmatrix} e^{j\varphi_{11}} \cdot e^{j\varphi_{d_1}} \cdot a_{11} & e^{j\varphi_{12}} \cdot e^{j\varphi_{d_1}} \cdot a_{12} \\ e^{j\varphi_{21}} \cdot e^{j\varphi_{d_2}} \cdot a_{21} & e^{j\varphi_{22}} \cdot e^{j\varphi_{d_2}} \cdot a_{22} \end{pmatrix}^{-1} =$$

with $\tilde{S}_{11} = \dfrac{e^{j\varphi_{11}} \cdot e^{j\varphi_{d_1}} \cdot b_{11} \cdot e^{j\varphi_{22}} \cdot e^{j\varphi_{d_2}} \cdot a_{22} - e^{j\varphi_{12}} \cdot e^{j\varphi_{d_1}} \cdot b_{12} \cdot e^{j\varphi_{21}} \cdot e^{j\varphi_{d_2}} \cdot a_{21}}{e^{j\varphi_{11}} \cdot e^{j\varphi_{d_1}} \cdot a_{11} \cdot e^{j\varphi_{22}} \cdot e^{j\varphi_{d_2}} \cdot a_{22} - e^{j\varphi_{12}} \cdot e^{j\varphi_{d_1}} \cdot a_{12} \cdot e^{j\varphi_{21}} \cdot e^{j\varphi_{d_2}} \cdot a_{21}}$ $$\tilde{S}_{21} = \frac{e^{j\varphi_{21}} \cdot e^{j\varphi_{d_2}} \cdot b_{21} \cdot e^{j\varphi_{22}} \cdot e^{j\varphi_{d_2}} \cdot a_{22} - e^{j\varphi_{22}} \cdot e^{j\varphi_{d_2}} \cdot b_{22} \cdot e^{j\varphi_{21}} \cdot e^{j\varphi_{d_2}} \cdot a_{21}}{e^{j\varphi_{11}} \cdot e^{j\varphi_{d_1}} \cdot a_{11} \cdot e^{j\varphi_{22}} \cdot e^{j\varphi_{d_2}} \cdot a_{22} - e^{j\varphi_{12}} \cdot e^{j\varphi_{d_1}} \cdot a_{12} \cdot e^{j\varphi_{21}} \cdot e^{j\varphi_{d_2}} \cdot a_{21}}$$

$$\tilde{S}_{12} = \frac{-e^{j\varphi_{11}} \cdot e^{j\varphi_{d_1}} \cdot b_{11} \cdot e^{j\varphi_{12}} \cdot e^{j\varphi_{d_1}} \cdot a_{12} + e^{j\varphi_{12}} \cdot e^{j\varphi_{d_1}} \cdot b_{12} \cdot e^{j\varphi_{11}} \cdot e^{j\varphi_{d_1}} \cdot a_{11}}{e^{j\varphi_{11}} \cdot e^{j\varphi_{d_1}} \cdot a_{11} \cdot e^{j\varphi_{22}} \cdot e^{j\varphi_{d_2}} \cdot a_{22} - e^{j\varphi_{12}} \cdot e^{j\varphi_{d_1}} \cdot a_{12} \cdot e^{j\varphi_{21}} \cdot e^{j\varphi_{d_2}} \cdot a_{21}}$$

$$\tilde{S}_{22} = \frac{-e^{j\varphi_{21}} \cdot e^{j\varphi_{d_2}} \cdot b_{21} \cdot e^{j\varphi_{12}} \cdot e^{j\varphi_{d_1}} \cdot a_{12} + e^{j\varphi_{22}} \cdot e^{j\varphi_{d_2}} \cdot b_{22} \cdot e^{j\varphi_{11}} \cdot e^{j\varphi_{d_1}} \cdot a_{11}}{e^{j\varphi_{11}} \cdot e^{j\varphi_{d_1}} \cdot a_{11} \cdot e^{j\varphi_{22}} \cdot e^{j\varphi_{d_2}} \cdot a_{22} - e^{j\varphi_{12}} \cdot e^{j\varphi_{d_1}} \cdot a_{12} \cdot e^{j\varphi_{21}} \cdot e^{j\varphi_{d_2}} \cdot a_{21}}$$

According to equation (9), different values are obtained between the exact scattering parameters S and the scattering parameters $\tilde{S}$ in the case of a use of a non-phase-reproducible signal generator and in the case of a use of system-error-adjusted signals, in each case incoming and outgoing at the individual ports to be measured of the frequency-converting device under test.

With the approximation $b_{12}=a_{12}=0$, the relationship according to equation (10) is obtained for the approximated reflection parameter $\tilde{\tilde{S}}_{11}$ at port 1 of the frequency-converting device under test.

$$\tilde{\tilde{S}}_{11} \approx \frac{e^{j\varphi_{11}} \cdot e^{j\varphi_{d_1}} \cdot b_{11} \cdot e^{j\varphi_{22}} \cdot e^{j\varphi_{d_2}} \cdot a_{22}}{e^{j\varphi_{11}} \cdot e^{j\varphi_{d_1}} \cdot a_{11} \cdot e^{j\varphi_{22}} \cdot e^{j\varphi_{d_2}} \cdot a_{22}} = \frac{b_{11}}{a_{11}} \quad (10)$$

With the identical approximation $b_{12}=a_{12}=0$, the relationship according to equation (11) is obtained for the approximated transmission parameter $\tilde{\tilde{S}}_{21}$ between port 1 and port 2 of the frequency-converting device under test.

$$\tilde{\tilde{S}}_{21} \approx \frac{e^{j\varphi_{21}} \cdot e^{j\varphi_{d_2}} \cdot b_{21} \cdot e^{j\varphi_{22}} \cdot e^{j\varphi_{d_2}} \cdot a_{22} - e^{j\varphi_{22}} \cdot e^{j\varphi_{d_2}} \cdot b_{22} \cdot e^{j\varphi_{21}} \cdot e^{j\varphi_{d_2}} \cdot a_{21}}{e^{j\varphi_{11}} \cdot e^{j\varphi_{d_1}} \cdot a_{11} \cdot e^{j\varphi_{22}} \cdot e^{j\varphi_{d_2}} \cdot a_{22}} \quad (11)$$

-continued $$= \frac{e^{j\varphi_{21}} \cdot e^{j\varphi_{d_2}} \cdot e^{j\varphi_{22}} \cdot e^{j\varphi_{d_2}}}{e^{j\varphi_{11}} \cdot e^{j\varphi_{d_1}} \cdot e^{j\varphi_{22}} \cdot e^{j\varphi_{d_2}}} \cdot \frac{b_{21} \cdot a_{22} - b_{22} \cdot a_{21}}{a_{11} \cdot a_{22}}$$

$$= \frac{e^{j\varphi_{21}} \cdot e^{j\varphi_{d_2}}}{e^{j\varphi_{11}} \cdot e^{j\varphi_{d_1}}} \cdot \frac{b_{21} \cdot a_{22} - b_{22} \cdot a_{21}}{a_{11} \cdot a_{22}}$$

The approximation for the reflection parameter $\tilde{\tilde{S}}_{11}$ at port 1 of the frequency-converting device under test according to equation (10) is independent of the phase uncertainty, while the approximation for the transmission parameter $\tilde{\tilde{S}}_{21}$ between port 1 and port 2 of the frequency-converting device under test according to equation (11) provides a non-compensated phase uncertainty with an approximately compensated amplitude uncertainty.

In the second step, the scattering parameters of a frequency-converting device under test are now derived in the case of a phase-reproducible signal generator according to one embodiment.

In the case of the phase-reproducible signal generator according to one embodiment, the phases of the excitation signal for the frequency-converting device under test, of the local oscillator signal for the frequency-converting device under test and of the oscillator signals for the mixers used in the individual measurement-signal paths are initialized for every measurement to the identical phase value. The individual system-error adjusted, incoming and outgoing signals consequently only provide a phase uncertainty $e^{j\varphi_i}$ dependent upon the phase distortion in the individual signal paths mentioned above. The matrix $\tilde{A}$ of which the matrix elements contain the system-error-adjusted, incoming signals $\tilde{a}_{ij}{}'$ at the respective ports i to be measured of the frequency-converting device under test in the case of an excitation of the frequency-converting device under test, in each case at one of the two ports j to be measured, is obtained according to equation (12), while the matrix $\tilde{B}$, of which the matrix elements contain the system-error-adjusted, outgoing signals $\tilde{b}_{ij}{}'$ at the respective ports i to be measured of the frequency-converting device under test, in the case of an excitation of the frequency-converting device under test, in each case at one of the two ports j to be measured, are obtained according to equation (13).

$$\tilde{A} = \begin{pmatrix} \tilde{a}'_{11} & \tilde{a}'_{12} \\ \tilde{a}'_{21} & \tilde{a}'_{22} \end{pmatrix} \quad (12)$$

$$= \begin{pmatrix} e^{j\varphi_1} \cdot e^{j\varphi_{d_1}} \cdot a_{11} & e^{j\varphi_1} \cdot e^{j\varphi_{d_1}} \cdot a_{12} \\ e^{j\varphi_2} \cdot e^{j\varphi_{d_2}} \cdot a_{21} & e^{j\varphi_2} \cdot e^{j\varphi_{d_2}} \cdot a_{22} \end{pmatrix}$$

$$= \begin{pmatrix} e^{j\varphi_1} \cdot e^{j\varphi_{d_1}} & 0 \\ 0 & e^{j\varphi_2} \cdot e^{j\varphi_{d_2}} \end{pmatrix} \cdot \begin{pmatrix} a_{11} & a_{12} \\ a_{21} & a_{22} \end{pmatrix}$$

$$= D \cdot A$$

with $$D = \begin{pmatrix} e^{j\varphi_1} \cdot e^{j\varphi_{d_1}} & 0 \\ 0 & e^{j\varphi_2} \cdot e^{j\varphi_{d_2}} \end{pmatrix}$$

-continued $$\tilde{B} = \begin{pmatrix} \tilde{b}'_{11} & \tilde{b}'_{12} \\ \tilde{b}'_{21} & \tilde{b}'_{22} \end{pmatrix} \quad (13)$$

$$= \begin{pmatrix} e^{j\varphi_1} \cdot e^{j\varphi_{d_1}} \cdot b_{11} & e^{j\varphi_1} \cdot e^{j\varphi_{d_1}} \cdot b_{12} \\ e^{j\varphi_2} \cdot e^{j\varphi_{d_2}} \cdot b_{21} & e^{j\varphi_2} \cdot e^{j\varphi_{d_2}} \cdot b_{22} \end{pmatrix}$$

$$= \begin{pmatrix} e^{j\varphi_1} \cdot e^{j\varphi_{d_1}} & 0 \\ 0 & e^{j\varphi_2} \cdot e^{j\varphi_{d_2}} \end{pmatrix} \cdot \begin{pmatrix} b_{11} & b_{12} \\ b_{21} & b_{22} \end{pmatrix}$$

$$= D \cdot B$$

With the matrix D containing the phase uncertainties $e^{j\varphi_1}$, $e^{j\varphi_2}$, $e^{j\varphi_{a_1}}$ and $e^{j\varphi_{a_n}}$, the scattering matrix $\tilde{S}$ can be formulated in the case of a use of a phase-reproducible signal generator according to one embodiment and with use of system-error-adjusted signals $\tilde{a}_{ij}{}'$ and $\tilde{b}_{ij}{}'$ in each case incoming and outgoing at the individual ports to be measured of the frequency-converting device under test.

$$\tilde{S} = \tilde{B} \cdot \tilde{A}^{-1} \quad (14)$$

$$= D \cdot B \cdot (D \cdot A)^{-1}$$

$$= D \cdot B \cdot A^{-1} \cdot D^{-1}$$

$$= D \cdot S \cdot D^{-1}$$

$$= \begin{pmatrix} e^{j\varphi_1} \cdot e^{j\varphi_{d_1}} & 0 \\ 0 & e^{j\varphi_2} \cdot e^{j\varphi_{d_2}} \end{pmatrix} \cdot \begin{pmatrix} S_{11} & S_{12} \cdot a^*_{LO} \\ S_{21} \cdot a_{LO} & S_{22} \end{pmatrix} \cdot$$

$$\begin{pmatrix} \frac{1}{e^{j\varphi_1} \cdot e^{j\varphi_{d_1}}} & 0 \\ 0 & \frac{1}{e^{j\varphi_2} \cdot e^{j\varphi_{d_2}}} \end{pmatrix}$$

$$= \begin{pmatrix} \frac{e^{j\varphi_1} \cdot e^{j\varphi_{d_1}} \cdot S_{11}}{e^{j\varphi_1} \cdot e^{j\varphi_{d_1}}} & \frac{e^{j\varphi_1} \cdot e^{j\varphi_{d_1}} \cdot S_{12} \cdot e^{j\varphi_{a^*_{LO}}}}{e^{j\varphi_2} \cdot e^{j\varphi_{d_2}}} \\ \frac{e^{j\varphi_2} \cdot e^{j\varphi_{d_2}} \cdot S_{21} \cdot e^{j\varphi_{a_{LO}}}}{e^{j\varphi_1} \cdot e^{j\varphi_{d_1}}} & \frac{e^{j\varphi_2} \cdot e^{j\varphi_{d_2}} \cdot S_{22}}{e^{j\varphi_2} \cdot e^{j\varphi_{d_2}}} \end{pmatrix}$$

$$= \begin{pmatrix} S_{11} & \frac{e^{j\varphi_1} \cdot e^{j\varphi_{d_1}} \cdot S_{12} \cdot e^{j\varphi_{a^*_{LO}}}}{e^{j\varphi_2} \cdot e^{j\varphi_{d_2}}} \\ \frac{e^{j\varphi_2} \cdot e^{j\varphi_{d_2}} \cdot S_{21} \cdot e^{j\varphi_{a_{LO}}}}{e^{j\varphi_1} \cdot e^{j\varphi_{d_1}}} & S_{22} \end{pmatrix}$$

The measured and corrected reflection parameters $\tilde{S}_{11}$ and $\tilde{S}_{22}$ of the scattering matrix $\tilde{S}$ with use of a phase-reproducible signal generator according to one embodiment and with use of system-error-adjusted signals $\tilde{a}_{ij}{}'$ and $\tilde{b}_{ij}{}'$ in each case incoming and outgoing at the individual ports to be measured of the frequency-converting device under test correspond to the exact reflection parameters $S_{11}$ and $S_{22}$ of a corresponding frequency-converting device under test.

Starting from equation (14) and with reference to equation (7), the transmission parameter $\tilde{S}_{11}$ is accordingly calculated according to equation (15), and the transmission parameter $\tilde{S}_{22}$ according to equation (16).

$$\tilde{S}_{11} = \frac{\tilde{b}'_{11} \cdot \tilde{a}'_{22} - \tilde{b}'_{12} \cdot \tilde{a}'_{21}}{\tilde{a}'_{11} \cdot \tilde{a}'_{22} - \tilde{a}'_{12} \cdot \tilde{a}'_{21}} \quad (15)$$

$$\tilde{S}_{22} = \frac{-\tilde{b}'_{21} \cdot \tilde{a}'_{12} + \tilde{b}'_{22} \cdot \tilde{a}'_{11}}{\tilde{a}'_{11} \cdot \tilde{a}'_{22} - \tilde{a}'_{12} \cdot \tilde{a}'_{21}} \quad (16)$$

By contrast, starting from equation (14) and with reference to equation (7), the transmission parameters $\tilde{S}_{12}$ and $\tilde{S}_{21}$ according to equation (17) and (18) provide additional phase uncertainties in the case of a use of a phase-reproducible signal generator according to one embodiment the invention and with use of system-error-adjusted signals $\tilde{a}_{ij}'$ and $\tilde{b}_{ij}'$ in each case incoming and outgoing at the individual ports to be measured of the frequency-converting device under test.

$$\tilde{S}_{12} = \frac{-\tilde{b}'_{11} \cdot \tilde{a}'_{12} + \tilde{b}'_{12} \cdot \tilde{a}'_{11}}{\tilde{a}'_{11} \cdot \tilde{a}'_{22} - \tilde{a}'_{12} \cdot \tilde{a}'_{21}} \cdot \frac{e^{j\varphi_2} \cdot e^{j\varphi_{d_2}}}{e^{j\varphi_1} \cdot e^{j\varphi_{d_1}} \cdot e^{j\varphi_{a_{Lo}}^*}} \quad (17)$$

$$\tilde{S}_{21} = \frac{\tilde{b}'_{21} \cdot \tilde{a}'_{22} - \tilde{b}'_{22} \cdot \tilde{a}'_{21}}{\tilde{a}'_{11} \cdot \tilde{a}'_{22} - \tilde{a}'_{12} \cdot \tilde{a}'_{21}} \cdot \frac{e^{j\varphi_1} \cdot e^{j\varphi_{d_1}}}{e^{j\varphi_2} \cdot e^{j\varphi_{d_2}} \cdot e^{j\varphi_{a_{Lo}}^*}} \quad (18)$$

These phase uncertainties include the unknown phase distortions $e^{j\varphi_1}$ and $e^{j\varphi_2}$ in the four measurement signal paths 26, 26', 26" and 26"' and the unknown phases $e^{j\varphi_{d_1}}$ and $e^{j\varphi_{d_2}}$ of the unknown complex factor $d_1$ and $d_2$ in the system errors associated respectively with the ports 1 and 2, and also the unknown phases $e^{j\varphi_{a_{Lo}}}$ respectively $e^{j\varphi_{a_{Lo}}^*}$ of the local oscillator signal $a_{Lo}$. Since only the magnitudes are relevant in the vast majority of cases when measuring the transmission parameters $S_{12}$ and $S_{21}$ in practice, these phase uncertainties are dispensed with.

The frequency-converting device under test—typically a mixer—generates, on the basis of its non-linear transmission characteristic, higher harmonics, or respectively intermodulation products. These are superposed on the fundamental harmonics at the ports of the device under test and are transmitted to the ports of the network analyzer. As a result of error matchings at the port of the network analyzer, the higher harmonics, respectively intermodulation products, are reflected to the ports of the device under test and additionally mixed there with regard to their frequency position and, once again, transmitted to the ports of the network analyzer, and are superposed several times there at the same frequency with the fundamental harmonics of the signals incoming and outgoing at the respective port.

Figure 5:
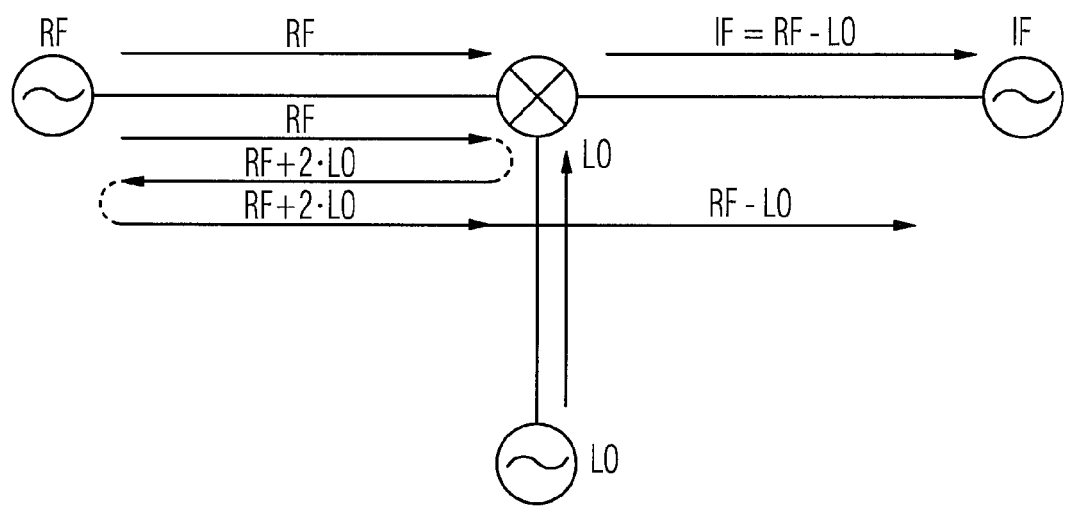
FIG. 5 a presentation of the spectral components occurring in each case by way of example at the individual ports of a mixer.

Alongside the excitation signal at the high-frequency RF, FIG. 5 shows the oscillator signal at the mixer frequency LO and the mixer output signal at the intermediate frequency IF, for example, the intermodulation product originally generated in the mixer at the frequency RF+2·LO. This intermodulation product is also transmitted to the high-frequency port RF of the network analyzer and reflected there at the frequency RF+2·LO and then mixed down again in the mixer to the high-frequency RF−LO. The signal generated in this manner from the intermodulation product is superposed on the excitation signal generated at the high-frequency port RF of the network analyzer at the high-frequency RF and leads to a falsification of the measured result. In order to identify this falsification, an additional measurement must be implemented in the mixer at the original frequency RF+2·LO of the intermodulation product.

For this purpose, in an equivalent manner to the fundamental harmonics in each case incoming and outgoing at the individual ports of the device under test, the signals incoming and outgoing in each case at the individual ports of the device under test are also registered at additional frequencies. From the signals $\hat{a}_{ij}^{kl}$ incoming in each case at the port i of the device under test, by way of example with three different frequencies k in the case of an excitation of the device under test at the port j, in each case with three frequencies l, a matrix $\hat{A}$ according to equation (19) is obtained. In an equivalent manner, a matrix $\hat{B}$ is obtained from the measured outgoing signals $\hat{b}_{ij}^{kl}$ in each case at the port i of the device under test with three different frequencies k in the case of an excitation of the device under test at the port j in each case with three frequencies l according to equation (20).

$$\hat{A} = \begin{bmatrix} \hat{a}_{11}^{11} & \hat{a}_{11}^{12} & \hat{a}_{11}^{13} & \hat{a}_{12}^{11} & \hat{a}_{12}^{12} & \hat{a}_{12}^{13} \\ \hat{a}_{11}^{21} & \hat{a}_{11}^{22} & \hat{a}_{11}^{23} & \hat{a}_{12}^{21} & \hat{a}_{12}^{22} & \hat{a}_{12}^{23} \\ \hat{a}_{11}^{31} & \hat{a}_{11}^{32} & \hat{a}_{11}^{33} & \hat{a}_{12}^{31} & \hat{a}_{12}^{32} & \hat{a}_{12}^{33} \\ \hat{a}_{21}^{11} & \hat{a}_{21}^{12} & \hat{a}_{21}^{13} & \hat{a}_{22}^{11} & \hat{a}_{22}^{12} & \hat{a}_{22}^{13} \\ \hat{a}_{21}^{21} & \hat{a}_{21}^{22} & \hat{a}_{21}^{23} & \hat{a}_{22}^{21} & \hat{a}_{22}^{22} & \hat{a}_{22}^{23} \\ \hat{a}_{21}^{31} & \hat{a}_{21}^{32} & \hat{a}_{21}^{33} & \hat{a}_{22}^{31} & \hat{a}_{22}^{32} & \hat{a}_{22}^{33} \end{bmatrix} \quad (19)$$

$$\hat{B} = \begin{bmatrix} \hat{b}_{11}^{11} & \hat{b}_{11}^{12} & \hat{b}_{11}^{13} & \hat{b}_{12}^{11} & \hat{b}_{12}^{12} & \hat{b}_{12}^{13} \\ \hat{b}_{11}^{21} & \hat{b}_{11}^{22} & \hat{b}_{11}^{23} & \hat{b}_{12}^{21} & \hat{b}_{12}^{22} & \hat{b}_{12}^{23} \\ \hat{b}_{11}^{31} & \hat{b}_{11}^{32} & \hat{b}_{11}^{33} & \hat{b}_{12}^{31} & \hat{b}_{12}^{32} & \hat{b}_{12}^{33} \\ \hat{b}_{21}^{11} & \hat{b}_{21}^{12} & \hat{b}_{21}^{13} & \hat{b}_{22}^{11} & \hat{b}_{22}^{12} & \hat{b}_{22}^{13} \\ \hat{b}_{21}^{21} & \hat{b}_{21}^{22} & \hat{b}_{21}^{23} & \hat{b}_{22}^{21} & \hat{b}_{22}^{22} & \hat{b}_{22}^{23} \\ \hat{b}_{21}^{31} & \hat{b}_{21}^{32} & \hat{b}_{21}^{33} & \hat{b}_{22}^{31} & \hat{b}_{22}^{32} & \hat{b}_{22}^{33} \end{bmatrix} \quad (20)$$

After a system-error adjustment of the matrix elements of the two matrices $\hat{A}$ and $\hat{B}$, a matrix $\tilde{A}$ is obtained in each case from the system-error-adjusted signals $\tilde{a}_{ij}^{kl'}$ incoming in each case at the port i of the device under test with three different frequencies k in the case of an excitation of the device under test at the port j, in each case with three frequencies l according to equation (21), and a matrix $\tilde{B}$ is obtained from the measured signals $\tilde{b}_{ij}^{kl'}$ outgoing in each case at the port i of the device under test with three different frequencies k in the case of an excitation of the device under test at the port j in each case with three frequencies l according to equation (22).

$$\tilde{A} = \begin{bmatrix} \tilde{a}_{11}^{11\prime} & \tilde{a}_{11}^{12\prime} & \tilde{a}_{11}^{13\prime} & \tilde{a}_{12}^{11\prime} & \tilde{a}_{12}^{12\prime} & \tilde{a}_{12}^{13\prime} \\ \tilde{a}_{11}^{21\prime} & \tilde{a}_{11}^{22\prime} & \tilde{a}_{11}^{23\prime} & \tilde{a}_{12}^{21\prime} & \tilde{a}_{12}^{22\prime} & \tilde{a}_{12}^{23\prime} \\ \tilde{a}_{11}^{31\prime} & \tilde{a}_{11}^{32\prime} & \tilde{a}_{11}^{33\prime} & \tilde{a}_{12}^{31\prime} & \tilde{a}_{12}^{32\prime} & \tilde{a}_{12}^{33\prime} \\ \tilde{a}_{21}^{11\prime} & \tilde{a}_{21}^{12\prime} & \tilde{a}_{21}^{13\prime} & \tilde{a}_{22}^{11\prime} & \tilde{a}_{22}^{12\prime} & \tilde{a}_{22}^{13\prime} \\ \tilde{a}_{21}^{21\prime} & \tilde{a}_{21}^{22\prime} & \tilde{a}_{21}^{23\prime} & \tilde{a}_{22}^{21\prime} & \tilde{a}_{22}^{22\prime} & \tilde{a}_{22}^{23\prime} \\ \tilde{a}_{21}^{31\prime} & \tilde{a}_{21}^{32\prime} & \tilde{a}_{21}^{33\prime} & \tilde{a}_{22}^{31\prime} & \tilde{a}_{22}^{32\prime} & \tilde{a}_{22}^{33\prime} \end{bmatrix} \quad (21)$$

$$\tilde{B} = \begin{bmatrix} \tilde{b}_{11}^{11\prime} & \tilde{b}_{11}^{12\prime} & \tilde{b}_{11}^{13\prime} & \tilde{b}_{12}^{11\prime} & \tilde{b}_{12}^{12\prime} & \tilde{b}_{12}^{13\prime} \\ \tilde{b}_{11}^{21\prime} & \tilde{b}_{11}^{22\prime} & \tilde{b}_{11}^{23\prime} & \tilde{b}_{12}^{21\prime} & \tilde{b}_{12}^{22\prime} & \tilde{b}_{12}^{23\prime} \\ \tilde{b}_{11}^{31\prime} & \tilde{b}_{11}^{32\prime} & \tilde{b}_{11}^{33\prime} & \tilde{b}_{12}^{31\prime} & \tilde{b}_{12}^{32\prime} & \tilde{b}_{12}^{33\prime} \\ \tilde{b}_{21}^{11\prime} & \tilde{b}_{21}^{12\prime} & \tilde{b}_{21}^{13\prime} & \tilde{b}_{22}^{11\prime} & \tilde{b}_{22}^{12\prime} & \tilde{b}_{22}^{13\prime} \\ \tilde{b}_{21}^{21\prime} & \tilde{b}_{21}^{22\prime} & \tilde{b}_{21}^{23\prime} & \tilde{b}_{22}^{21\prime} & \tilde{b}_{22}^{22\prime} & \tilde{b}_{22}^{23\prime} \\ \tilde{b}_{21}^{31\prime} & \tilde{b}_{21}^{32\prime} & \tilde{b}_{21}^{33\prime} & \tilde{b}_{22}^{31\prime} & \tilde{b}_{22}^{32\prime} & \tilde{b}_{22}^{33\prime} \end{bmatrix} \quad (22)$$

With reference to equations (14) to (18) in the case of a network analysis with a single frequency, the scattering matrix $\tilde{S}$ according to equation (23) is obtained for the network analysis, for example, with three frequencies, from the matrix elements of the matrices $\tilde{A}$ and $\tilde{B}$. The underlined matrix elements of the scattering matrix $\tilde{S}$ are the scattering parameters of the device under test in the case of a measurement with a single frequency.

$$\tilde{S} = \begin{bmatrix} \tilde{s}_{11}^{11} & \tilde{s}_{11}^{12} & \tilde{s}_{11}^{13} & \tilde{s}_{12}^{11} & \tilde{s}_{12}^{12} & \tilde{s}_{12}^{13} \\ \tilde{s}_{11}^{21} & \tilde{s}_{11}^{22} & \tilde{s}_{11}^{23} & \tilde{s}_{12}^{21} & \tilde{s}_{12}^{22} & \tilde{s}_{12}^{23} \\ \tilde{s}_{11}^{31} & \tilde{s}_{11}^{32} & \tilde{s}_{11}^{33} & \tilde{s}_{12}^{31} & \tilde{s}_{12}^{32} & \tilde{s}_{12}^{33} \\ \tilde{s}_{21}^{11} & \tilde{s}_{21}^{12} & \tilde{s}_{21}^{13} & \tilde{s}_{22}^{11} & \tilde{s}_{22}^{12} & \tilde{s}_{22}^{13} \\ \tilde{s}_{21}^{21} & \tilde{s}_{21}^{22} & \tilde{s}_{21}^{23} & \tilde{s}_{22}^{21} & \tilde{s}_{22}^{22} & \tilde{s}_{22}^{23} \\ \tilde{s}_{21}^{31} & \tilde{s}_{21}^{32} & \tilde{s}_{21}^{33} & \tilde{s}_{22}^{31} & \tilde{s}_{22}^{32} & \tilde{s}_{22}^{33} \end{bmatrix} \quad (23)$$

If a mixer is used in the mirror operating mode, and if the incoming and outgoing signals are measured at a mirror frequency, the coefficients in the matrices $\tilde{A}$ and $\tilde{B}$ must be used as a complex conjugate.

In this context, the scattering matrix $\tilde{S}$ with its individual coefficients $\tilde{S}_{ij}^{kl}$ is obtained according to equation (24) from the matrices $\tilde{A}$ and $\tilde{B}$ and their coefficients $\tilde{a}_{ij}^{kh}$ respectively $\tilde{b}_{ij}^{kh}$.

$$\tilde{S} = \tilde{B} \cdot \tilde{A}^{-1} \quad (24)$$

Figure 2:
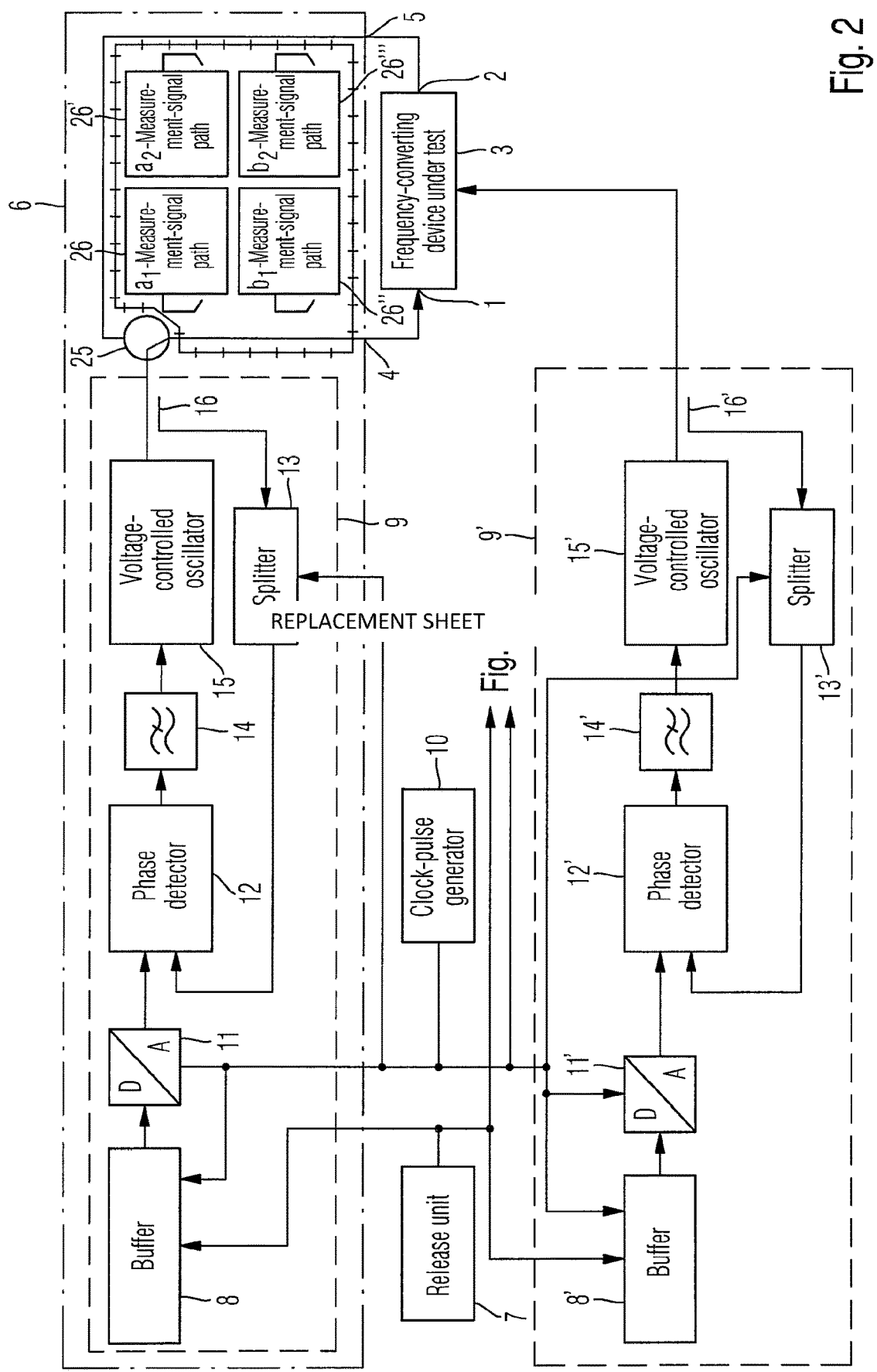
FIG. 2 a block-circuit diagram of a system for determining scattering parameters of a frequency-converting device under test, according to one embodiment.
Figure 3:
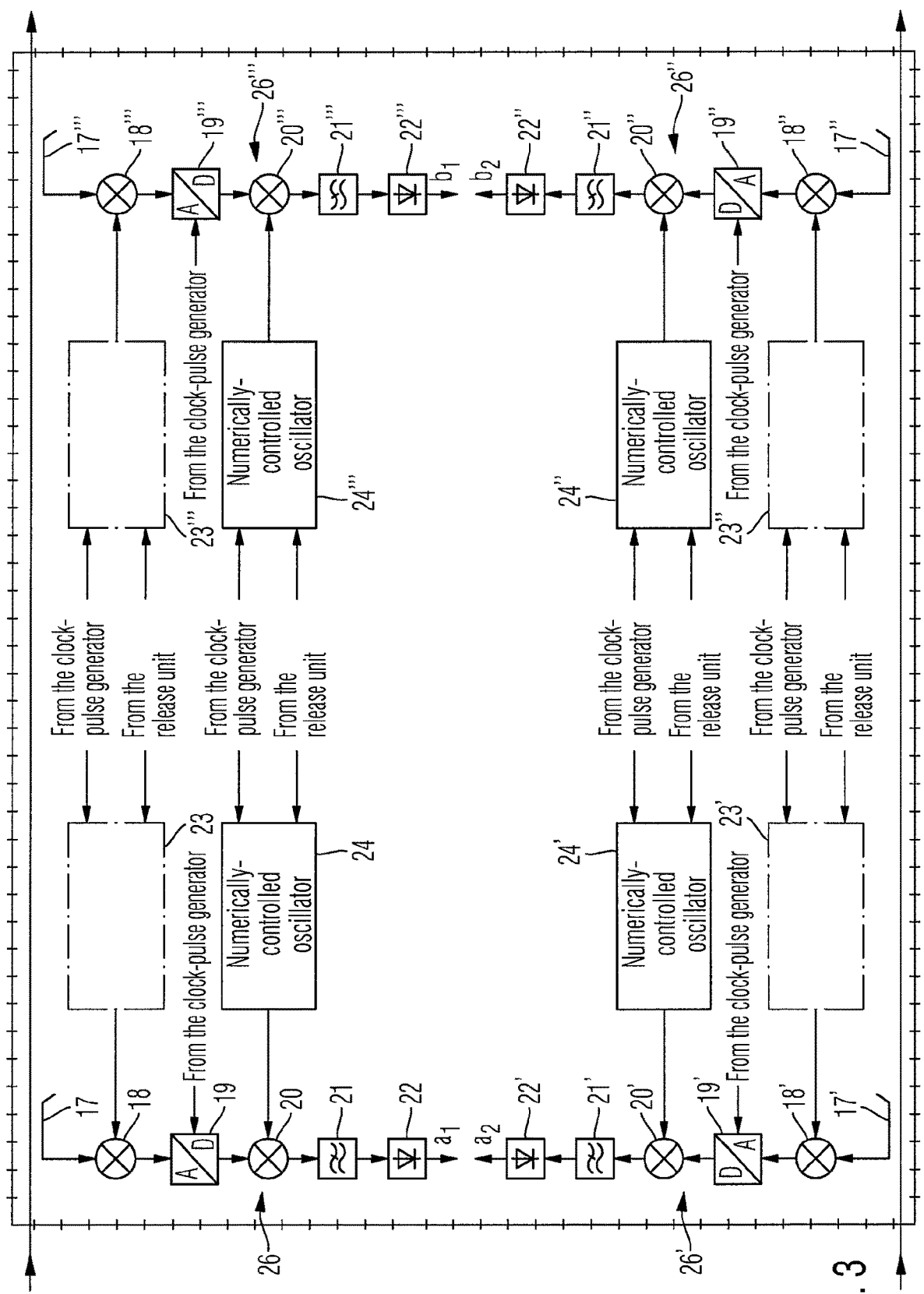
FIG. 3 a block-circuit diagram of a detail of a system for determining scattering parameters of a frequency-converting device under test, according to one embodiment.
Figure 4:
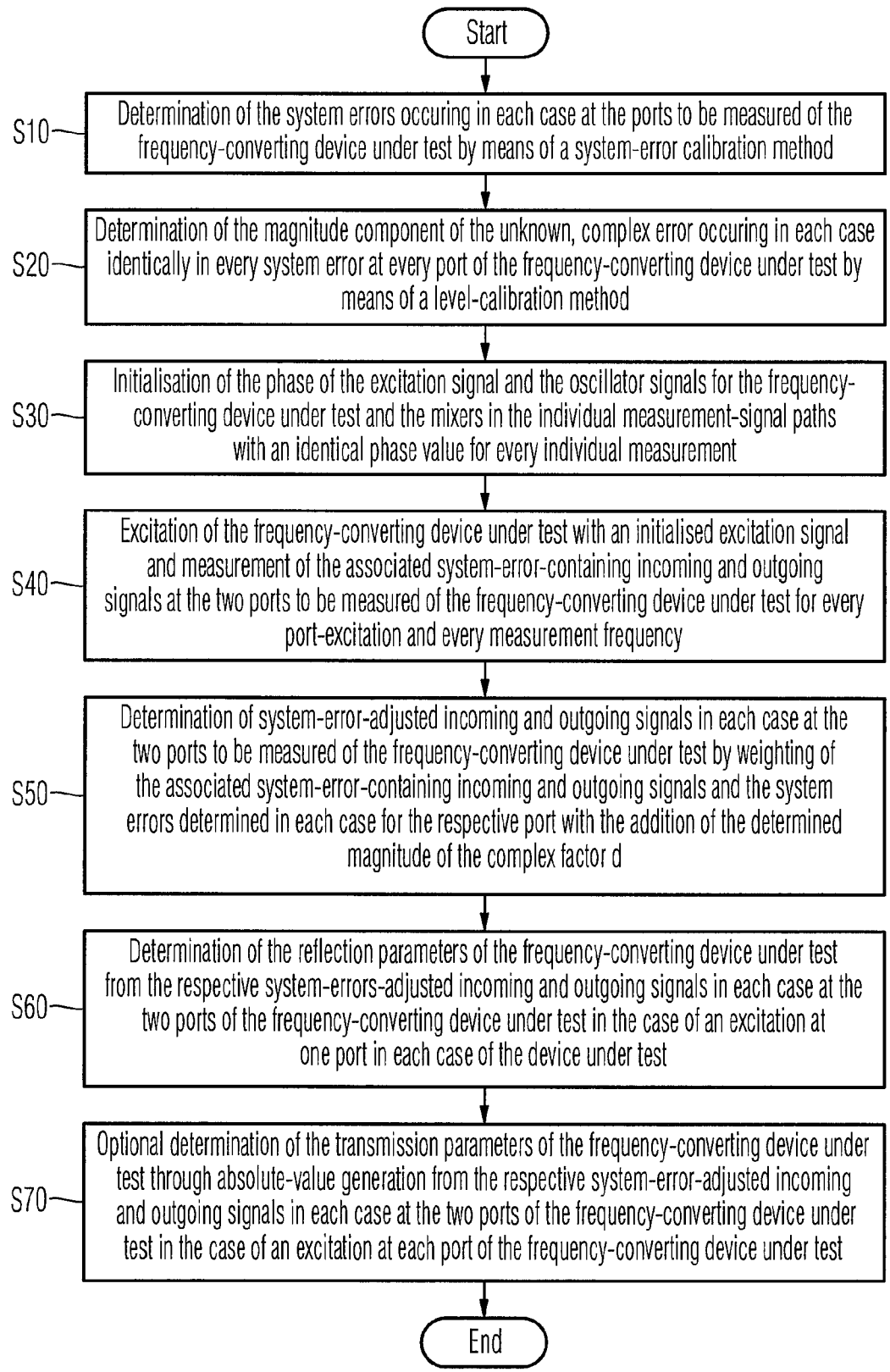
FIG. 4 a flow chart of a method for determining scattering parameters of a frequency-converting device under test, according to one embodiment.

With regard to this mathematical background, the method according to one embodiment for determining scattering parameters of a frequency-converting device under test will now be explained in detail with reference to the flow chart in FIG. 4, and the system for determining scattering parameters of a frequency-converting device under test according to one embodiment will be explained with reference to the block circuit diagrams in FIGS. 2 and 3.

In the first method step S10, the system errors occurring in each case at the ports 1 and 2 to be measured of the frequency-converting device under test 3 are determined by means of a conventional system-error calibration method. The known 7-term, 9-term and/or 10-term calibration methods can be used in this context.

In the next method step S20, the magnitude component $|d_i|$ of the unknown complex factor $d_i$, which is contained according to equation (5A) respectively (5B) in every coefficient of the level-optimized system-error matrix $\hat{G}_i'$, is determined by means of a level-calibration measurement. The system errors determined in the previous method step S10, which are used for the formation of the coefficients of the determined system-error matrix $\tilde{G}_i$, are divided by the determined magnitude component $|d_i|$ of the unknown complex factor $d_i$ to form the coefficients of the level-optimized system-error matrix $\hat{G}_i'$.

The matrix $\tilde{G}$ with the registered system errors, which contain this unknown complex factor $d_i$, is therefore converted into a matrix $\hat{G}'$ according to equation (5A) respectively (5B), which, in each case, now only contains the unknown phase $e^{j\varphi_{d_i}}$ of this unknown complex factor $d_i$ by comparison with the matrix G with the exact system errors.

In the next method step S30, the phase of the excitation signal is initialized with a phase value which is identical in every measurement. For this purpose, a release unit 7 generates an initialization signal which is supplied to a buffer 8 with phase values equidistant in time of a sinusoidal signal in a first signal generator 9 which generates the excitation signal. At the next clock pulse of a clock signal generated by the clock generator 10, the buffer 8 is signalled with this initialization signal to write to its output a selectable and previously specified phase value, which is stored in the buffer 8.

The phase value written to the output of the buffer 8 and also all subsequent phase values of the sinusoidal signal written with the clock pulse of the clock signal to the output of the buffer 8 are converted into a corresponding analog signal in a digital-analog converter 11 disposed downstream of the buffer 8 which is clocked by the clock signal of a clock generator 10. The analog signal is supplied to the input of a phase detector 12 associated with a phase controller and compared there with the frequency-reduced excitation signal.

The frequency reduction of the high-frequency excitation signal is implemented after decoupling in a coupler 16 within a frequency splitter 13 which is also clocked by the clock signal of the clock generator 10. The phase difference of the phase detector 12 is conventionally supplied to a low-pass filter 14 for the attenuation of higher frequency signal components in the phase locked loop and to a voltage-controlled oscillator 15 for the generation of the high-frequency excitation signal dependent upon the low-pass-filtered phase difference.

The phase of the local oscillator signal for the frequency-converting device under test 3 is initialized at the beginning of every measurement in a phase-coherent manner to the phase of the excitation signal, preferably also with the identical phase value. For this purpose, in an equivalent manner to the case of the phase initialization of the excitation signal in the first signal generator 9, a buffer 8' in a second signal generator 9' responsible for generating the local oscillator signal receives an initialization signal from the release unit 7 and a clock signal from a clock generator 10. As is evident from FIG. 2, the structural setup of the second signal generator 9' is identical to the structural setup of the first signal generator 9 and, in an equivalent manner, contains a digital-analog converter 11', a phase detector 12', a low-pass filter 14', a voltage-controlled oscillator 15', a coupler 16' and frequency splitter 13'.

The phases of the individual oscillator signals for the mixers contained in each of the individual measurement-signal paths are also initialized at the beginning of every measurement in a phase-coherent manner to the phase of the excitation signal, preferably with an identical phase value. The total of four measurement-signal paths 26, 26', 26''' and 26'''' for the measurement in each case of the incoming signals $\hat{a}_{11}$, $\hat{a}_{12}$, $\hat{a}_{22}$ and $\hat{a}_{22}$ and the outgoing signals $\hat{b}_{11}$, $\hat{b}_{12}$, $\hat{b}_{21}$ and $\hat{b}_{22}$ at the two ports 1 and 2 to be measured of the frequency-converting device under test 3 provide, as shown in FIG. 3, the identical structure, comprising a coupler 17, 17', 17'' and 17''', a first mixer 18, 18', 18'' and 18''' realized in an analog manner, an analog-digital converter 19, 19', 19'' and 19''', a second mixer 20, 20', 20'' and 20''' realized digitally, a digital low-pass filter 21, 21', 21'' and 21''' and a detector 22, 22', 22'' and 22'''.

The local-oscillator signal for the first mixer 18, 18', 18'' and 18''' realized in an analog manner is generated in each case in an associated signal generator 23, 23', 23'' and 23''', which provides an identical structural setup to the first signal generator 9 which generates the excitation signal or respectively to the second signal generator 9' which generates the local-oscillator signal for the frequency-converting device under test 3, and, for this purpose, receives an initialization signal from the release unit 7 and a clock signal from the clock generator 10.

The local-oscillator signal for the second digitally realized mixer 20, 20', 20'' and 20''' is generated in an associated numerically controlled oscillator 24, 24', 24'' and 24''' which contains at least one buffer with the phase values equidistant in time of a sinusoidal signal and is also supplied with the initialization signal of the release unit 7 and the clock signal of the clock generator 10. Additionally, the analog-digital converters 19, 19', 19" and 19'" in the individual measurement-signal paths are clocked with the clock signal of the clock generator 10.

In the next method step S40, the excitation signal generated in the first signal generator 7 is supplied via the corresponding switch position of the switch 25, via the associated port 4 or 5 of the network analyzer to one of the two ports 1 or 2 to be measured of the frequency-converting device under test 3, and, in each case, the system-error-containing incoming signals $\hat{a}_{11}$, $\hat{a}_{12}$, $\hat{a}_{21}$ and $\hat{a}_{22}$ at the two ports 1 and 2 to be measured of the frequency-converting device under test 3 and system-error-containing outgoing signals $\hat{b}_{11}$, $\hat{b}_{12}$, $\hat{b}_{21}$ und $\hat{b}_{22}$ in the associated measurement-signal paths 26, 26', 26" and 26'" are each registered with a single frequency for each port to be measured of the frequency-converting device under test 3.

In the case of a network analysis with several frequencies for each port to be measured of the frequency-converting device under test 3, the system-error-containing incoming signal $\hat{a}_{ij}^{kl}$ and the system-error-containing outgoing signal $\hat{b}_{ij}^{kl}$, in each case at the port i to be measured of the frequency-converting device under test 3 with the frequency k are registered in the case of an excitation of the frequency-converting device under test 3 at the port j with the frequency l. For the exemplary case of a measurement in each case with three frequencies for each port to be measured of the frequency-converting device under test 3, the system-error-containing incoming signals $\hat{a}_{ij}^{kl}$ and the system-error-containing outgoing signals $\hat{b}_{ij}^{kl}$ are obtained as matrix elements of the matrices $\hat{A}$ and $\hat{B}$ presented in equation (19) respectively (20).

In the next method step S50, in the case of a network analysis with a single frequency for each port to be measured of the frequency-converting device under test 3, in each case, the registered system-error-containing incoming signals $\hat{a}_{11}$, $\hat{a}_{12}$, $\hat{a}_{21}$ and $\hat{a}_{22}$ and system-error-containing outgoing signals $\hat{b}_{11}$, $\hat{b}_{12}$, $\hat{b}_{21}$ and $\hat{b}_{22}$ at the two ports 1 and 2 to be measured of the frequency-converting device under test 3 are weighted according to equation (5A) with the system errors registered at each of the two ports 1 and 2 of the frequency-converting device under test 3 in method step S10 and in each case by the magnitude component $|d_i|$ of the unknown complex factor $d_i$, in the subsequent method step S20, in order to obtain, in each case, system-error-adjusted incoming signals $\tilde{a}_{11}'$, $\tilde{a}_{12}'$, $\tilde{a}_{21}'$ and $\tilde{a}_{22}'$ and outgoing signals $\tilde{b}_{11}'$, $\tilde{b}_{12}'$, $\tilde{b}_{21}'$ and $\tilde{b}_{22}'$ at the two ports 1 and 2 of the frequency-converting device under test 3.

In an equivalent manner, in the case of a network analysis with several frequencies for each port to be measured of the frequency-converting device under test 3, in each case, the system-error-containing incoming signals $\hat{a}_{ij}^{kl}$ and system-error-containing outgoing signals $\hat{b}_{ij}^{kl}$, in each case at the respective port i to be measured of the frequency-converting device under test 3 with the respective frequency k, are weighted according to equation (5B) with the system errors registered at each of the two ports 1 and 2 of the frequency-converting device under test 3 in method step S10 and in each case by the magnitude component $|d_i|$ of the unknown complex factor $d_i$ in the subsequent method step S20, in order to obtain, in each case, system-error-adjusted incoming signals $\tilde{a}_{ij}^{kl}$ and outgoing signals $\tilde{b}_{ij}^{kl}$, in each case at the respective port i to be measured of the frequency-converting device under test 3 with the respective frequency k in the case of an excitation of the frequency-converting device under test 3 at the respective port j with the respective frequency l. For the exemplary case of a measurement with three frequencies for each port to be measured of the frequency-converting device under test 3, the system-error-adjusted incoming signals $\tilde{a}_{ij}^{kl}$ and the system-error-adjusted outgoing signals $\tilde{b}_{ij}^{kl}$ are obtained as matrix elements of the matrices $\tilde{A}$ and $\tilde{B}$ presented in equation (21) respectively (22).

In the next method step S60, in the case of a network analysis with a single frequency for each port, the reflection parameters $\tilde{S}_{11}$ and $\tilde{S}_{22}$ at the two ports 1 and 2 to be measured of the frequency-converting device under test 3 are determined according to equation (15) and (16) in each case from the system-error-adjusted incoming signals $\tilde{a}_{11}'$, $\tilde{a}_{12}'$, $\tilde{a}_{21}'$ and $\tilde{a}_{22}'$ and outgoing signals $\tilde{b}_{11}'$, $\tilde{b}_{12}'$, $\tilde{b}_{21}'$ and $\tilde{b}_{22}'$ at the two ports of the frequency-converting device under test 3.

In the case of a network analysis with several frequencies for each port of the frequency-converting device under test 3, the individual reflection parameters $\tilde{S}_{ii}^{kl}$ are determined in an equivalent manner at the with the frequency k at the port i of the frequency-converting device under test 3, in the case of an excitation of the frequency-converting device under test 3 at the respective port j with the respective frequency l according to equation (24), in each case from the system-error-adjusted incoming signals $\tilde{a}_{ij}^{kl}$ and outgoing signals $\tilde{b}_{ij}^{kl}$ at the individual ports j to be measured of the frequency-converting device under test 3 with the respective frequency k in the case of an excitation of the frequency-converting device under test 3 at the respective ports j with the respective frequencies l.

In the final, optionally implemented method step S70, in the case of a network analysis with a single frequency for each port of the frequency-converting device under test, the system-error-adjusted transmission parameter $\tilde{S}_{12}$ between the port 1 to be measured and the port 2 to be measured and the system-error-adjusted transmission parameter $\tilde{S}_{21}$ between the port 2 to be measured and the port 1 to be measured are also determined by absolute-value generation of equation (17) and (18) in each case from the system-error-adjusted incoming signals $\tilde{a}_{11}'$, $\tilde{a}_{12}'$, $\tilde{a}_{21}'$ and $\tilde{a}_{22}'$ and outgoing signals $\tilde{b}_{11}'$, $\tilde{b}_{12}'$, $\tilde{b}_{21}'$ and $\tilde{b}_{22}'$ at the two ports 1 and 2 of the frequency-converting device under test 3.

In the case of a network analysis with several frequencies for each port of the frequency-converting device under test 3, the transmission parameters $\tilde{S}_{ij}^{kl}$ to be determined with the individual frequencies k at the individual ports i of the frequency-converting device under test 3 in the case of an excitation of the frequency-converting device under test 3 at the individual ports j with the individual frequencies l are determined in an equivalent manner according to equation (24), in each case from the system-error-adjusted incoming signals $\tilde{a}_{ij}^{kl}$, and outgoing signals $\tilde{b}_{ij}^{kl}$ at the individual ports i to be measured of the frequency-converting device under test 3 with the respective frequency k in the case of an excitation of the frequency-converting device under test 3 at the respective ports j with the respective frequencies l.

For the exemplary case of a measurement in each case with three frequencies for each port to be measured of the frequency-converting device under test 3, the scattering matrix $\tilde{S}$ comprising reflection parameters $\tilde{S}_{ii}^{kl}$ and transmission parameters $\tilde{S}_{ij}^{kl}$ is obtained according to equation (23).

The invention is not restricted to the illustrated embodiment. In particular, all combinations of the features claimed in the claims, the features disclosed in the description and the features illustrated in the drawings are also covered by the invention.

The invention claimed is:

1. A method for determining scattering parameters of a frequency-converting device under test using a network analyzer with the following method steps:
   determination of system errors at the individual ports of the frequency-converting device under test by system-error calibration means,
   measurement of system-error containing signals incoming and outgoing in each case at the individual ports of the frequency-converting device under test,
   wherein coefficients of a determined system-error matrix are determined from the system errors measured for each port of the frequency-converting device under test, and
   wherein a level-optimized system-error matrix is determined by dividing the coefficients of the determined system-error matrix by a magnitude component of an unknown complex factor, which is determined in an additional calibration measurement,
   determination of system-error-adjusted signals incoming and outgoing in each case at the individual ports of the frequency-converting device under test by weighting the system-error-containing signals incoming and outgoing in each case at the individual ports of the frequency-converting device under test with the associated, determined system errors,
   determination of the scattering parameters of the frequency-converting device under test from the system-error-adjusted signals incoming and outgoing in each case at the individual ports of the frequency-converting device under test,
   determination of the scattering parameters of the frequency-converting device under test at frequencies at which higher harmonics and intermodulation products of the signals incoming and outgoing at the individual ports of the frequency-converting device under test occur,
   wherein the phase of a local-oscillator signal for the frequency-converting device under test and the signal which excites each port to be measured of the frequency-converting device under test is initialized in an identical manner in every measurement, and
   wherein a clock pulse is generated which is supplied to a buffer of a signal generator for a clock synchronous output of buffered phase values at the output of the buffer.

2. The method according to claim 1,
   wherein the phase of the local-oscillator signal is initialized for the frequency-converting device under test in every measurement in a phase-coherent manner to the phase of the excitation signal.

3. The method according to claim 1,
   wherein the phases of the oscillator signals are initialized in at least one mixer in the individual measurement-signal paths in a phase-coherent manner to the phase of the excitation signal.

4. The method according to claim 1,
   wherein the coefficients of a determined system-error matrix, which are determined from the system errors measured for each port of the frequency-converting device under test, are each dependent upon an unknown complex factor.

5. The method according to claim 1,
   wherein the system-error-adjusted signals incoming and outgoing in each case at the individual ports of the frequency-converting device under test are determined by weighting the system-error-containing signals incoming and outgoing in each case at the individual ports of the frequency-converting device under test with the associated coefficients of the level-optimized system-error matrix.

6. The method according to claim 5,
   wherein the magnitudes of the two transmission parameters of the scattering parameters of the frequency-converting device under test are determined from the system-error-adjusted signals incoming and outgoing in each case at the two ports of the frequency-converting device under test.

7. The method according to claim 5,
   wherein the two reflection parameters of the scattering parameters of the frequency-converting device under test are determined in each case from the system-error-adjusted signals incoming and outgoing in each case at the two ports of the frequency-converting device under test.

8. The method according to claim 5,
   wherein the measured signals incoming and outgoing in each case at the two ports of the frequency-converting device under test is, in each case, a signal incoming or respectively outgoing at the measuring port with a given frequency, and the system-error-adjusted signals incoming and outgoing in each case at the two ports of the frequency-converting device under test is, in each case, a system-error-adjusted signal incoming or respectively outgoing at the measuring port with the frequency, if the excitation of the device under test takes place at the excitation port at a given frequency.

9. The method according to claim 8,
   wherein the magnitude of the transmission parameter of the scattering parameters of the frequency-converting device under test in the case of a measurement with the frequency at the measuring port and in the case of an excitation with the frequency at the excitation port is determined from the individual system-error-adjusted signals incoming and outgoing in each case with all frequencies at all measuring ports of the frequency-converting device under test in the case of an excitation with all frequencies at all excitation ports.

10. The method according to claim 8,
    wherein the reflection parameter of the scattering parameters of the frequency-converting device under test is determined in the case of a measurement with the frequency at the measuring port, and in the case of an excitation with the frequency at the excitation port in each case from the individual system-error-adjusted signals incoming and outgoing in each case at all frequencies at all measuring ports of the frequency-converting device under test in the case of an excitation with all frequencies at all excitation ports.

11. A system for determining scattering parameters of a frequency-converting device under test using a network analyzer with a frequency-converting device under test, comprising:
    the network analyzer for the impression of an excitation signal at one of the two ports to be measured of the frequency-converting device under test and for the measurement of the signals incoming and outgoing in each case at one of the two ports to be measured,
    wherein the measurement is done at frequencies at which fundamental and/or higher harmonics and intermodulation products of the signals incoming and outgoing at the individual ports of the frequency-converting device under test occur, a first signal generator disposed in the network analyzer for the generation of the excitation signal and a second signal generator for the generation of a local-oscillator signal for the frequency-converting device under test, wherein the phase of a local-oscillator signal for the frequency-converting device under test and the excitation signal is initialized in an identical manner in each case in every individual measurement, wherein a release unit is additionally provided for the generation of a signal for an initialization of a buffer of the first and second signal generator, and wherein a clock-pulse generator is provided for the generation of a clock pulse which is supplied to the buffer of the first and second signal generator for the clock-synchronous output of the buffered phase values at the output of the buffer.

12. The system according to claim 11, wherein the first and second signal generator contains a signal generation according to the direct-digital synthesis principle, in each case with the buffer in which different phase values distanced equidistantly in time of a sinusoidal signal are stored.

13. The system according to claim 11, wherein the signal for the initialization is supplied to the buffer of the first and second signal generator for the output-end output of a given phase value at the next clock pulse following the initialization.

14. The system according to claim 12, wherein in each case, a digital-analog converter for the digital-analog conversion of the output-end, discrete phase values disposed in the respective buffer into a corresponding analog signal is connected downstream of the buffer of the first and second signal generator and, in each case, a phase-locked loop for the output-end generation of the excitation signal, respectively of the local-oscillator signal, dependent upon the input-end analog signal serving as a reference signal, is connected downstream of the respective digital-analog converter.

15. The system according to claim 11, wherein the phases of further oscillator signals for at least one mixer, in each case in one of the measurement signal paths of the network analyzer, are initialized in a phase-coherent manner to the phase of the excitation signal.

16. The system according to claim 11, wherein for the generation of every oscillator signal for each mixer, a signal generator realized in an analog and/or digital manner is provided in each measurement-signal path.

17. The system according to claim 16, wherein for the generation of an oscillator signal for a mixer, every signal generator realized in an analog and/or digital manner provides in each measurement-signal path a buffer for the storage of phase values of a sinusoidal signal stored equidistantly in time.

18. The system according to claim 16, wherein for the generation of an oscillator signal for a mixer, every signal generator realized in an analog and/or digital manner is connected in a measurement-signal path to the clock-pulse generator for the clocked output of the phase values of a sinusoidal signal stored in the respective buffer and to the release unit for the initialization of the respective buffer with the next clock pulse following the initialization.

* * * * *

UNITED STATES PATENT AND TRADEMARK OFFICE
CERTIFICATE OF CORRECTION

PATENT NO. : 10,605,839 B2
APPLICATION NO. : 14/416598
DATED : March 31, 2020
INVENTOR(S) : Andreas Paech et al.

Page 1 of 1

It is certified that error appears in the above-identified patent and that said Letters Patent is hereby corrected as shown below:

On the Title Page

Column 1, Item (72), the 2nd Inventor's information which reads:
"Ortler, Geesertshausen (DE); Steffen"
Should read:
"Ortler, Gessertshausen (DE); Steffen"

Signed and Sealed this
Twenty-third Day of June, 2020

Andrei Iancu
*Director of the United States Patent and Trademark Office*